(12) United States Patent
Jiwari (10) Patent No.: US 6,669,812 B2
(45) Date of Patent: *Dec. 30, 2003

(54) APPARATUS AND METHOD FOR FABRICATING SEMICONDUCTOR DEVICE

(75) Inventor: Nobuhiro Jiwari, Osaka (JP)

(73) Assignee: Matsushita Electric Industrial Co., Ltd., Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 185 days.

(21) Appl. No.: 09/145,127

(22) Filed: Sep. 1, 1998

(65) Prior Publication Data

US 2001/0047849 A1 Dec. 6, 2001

(30) Foreign Application Priority Data

Sep. 2, 1997 (JP) .............................. 9-237144

(51) Int. Cl.⁷ ........................... H05H 1/00; C23C 16/00
(52) U.S. Cl. ........................... 156/345.47; 156/345.24; 118/723 E; 118/715
(58) Field of Search .................. 156/345.47, 345.24; 118/723 E, 723 I, 723 MW, 712, 715; 216/58, 59, 60, 65, 66, 68, 69, 70, 71

(56) References Cited

U.S. PATENT DOCUMENTS

| | | | | |
|---|---|---|---|---|
| 4,633,809 A | * | 1/1987 | Hirose et al. ............... | 118/719 |
| 4,664,938 A | * | 5/1987 | Walker ....................... | 427/578 |
| 4,828,874 A | * | 5/1989 | Hiraoka et al. ............ | 427/554 |
| 4,962,727 A | * | 10/1990 | Harada .................... | 118/723 R |
| 5,015,492 A | * | 5/1991 | Venkatesan et al. ........... | 427/8 |
| 5,347,138 A | * | 9/1994 | Aqui et al. ................. | 250/573 |
| 5,456,796 A | | 10/1995 | Gupta et al. | |
| 5,472,550 A | * | 12/1995 | Periasamy ............... | 156/345.1 |
| 5,789,867 A | * | 8/1998 | Westendorp et al. .... | 315/111.21 |
| 5,885,352 A | * | 3/1999 | Miyajima .................... | 118/708 |
| 5,904,800 A | * | 5/1999 | Mautz ........................ | 156/345 |
| 5,968,379 A | * | 10/1999 | Zhao et al. ............ | 219/121.52 |
| 5,985,032 A | * | 11/1999 | Eriguchi ..................... | 118/712 |
| 5,993,678 A | * | 11/1999 | Ohkawa ...................... | 216/68 |
| 6,037,313 A | * | 3/2000 | Nagaishi et al. ............. | 505/474 |

FOREIGN PATENT DOCUMENTS

| | | | | |
|---|---|---|---|---|
| JP | 2-258048 A | * | 10/1990 | ............. B01J/3/00 |
| JP | 6-291054 A | * | 10/1994 | ......... H01L/21/205 |
| JP | 7-211645 A | * | 8/1995 | ......... H01L/21/205 |
| JP | 9-213679 A | * | 8/1997 | ....... H01L/21/3065 |

OTHER PUBLICATIONS

IBM Technical Disclosure Bulletin, Sep. 1991, US vol. No. 34. pp. 338–339.*

* cited by examiner

Primary Examiner—Parviz Hassanzadeh
(74) Attorney, Agent, or Firm—McDermott, Will & Emery (57) ABSTRACT

The present invention provides various measures for preventing particles from being deposited on objects being processed during plasma processing. An electrode is disposed inside a reaction chamber, which is kept in a vacuum state by a turbo molecule pump and a dry pump that are provided for a main exhaust pipe. A substrate is placed on the electrode, a gas is introduced into the reaction chamber and then a voltage is applied from an RF power supply to the electrode and the substrate, thereby generating plasma regions in the reaction chamber. A large number of exhaust pipes, each having an opening, are disposed on substantially the same plane as the plane on which the interface between a plasma glow region and a plasma sheath is located. These multiple openings surround the interface between the plasma glow region and the plasma sheath.

10 Claims, 5 Drawing Sheets

APPARATUS AND METHOD FOR FABRICATING SEMICONDUCTOR DEVICE

BACKGROUND OF THE INVENTION

The present invention generally relates to an apparatus for fabricating a semiconductor device by using plasma and a method for fabricating the semiconductor device, and more particularly relates to measures taken for preventing particles from depositing on an object to be processed.

Plasma processing is currently utilized at various stages in the fabrication of a semiconductor device. It is known that particles such as reactants are generated during the plasma processing. For example, such reactants are generated as a result of the decomposition of a source gas, the reaction between the source gas and an object to be processed (e.g., a semiconductor substrate) and the like. Although many of these particles are pumped out of the reaction chamber through an exhaust port along with the gas, part of the particles are deposited on the substrate processed, thereby deteriorating the properties of the substrate in various respects. The deposition of such particles plays a significant role in causing various defects in semiconductor devices. Accordingly, in order to increase the yield of semiconductor devices, it is desirable to fabricate the devices by taking every measure to prevent contaminants, such as particles, from being deposited on the surface of a substrate during a fabrication process.

In view of this demand, many techniques have heretofore been suggested as to the measures taken to control the generation of particles such as reactants during plasma processing or to prevent such particles from being deposited on a substrate. However, under current circumstances, these problems have not been drastically solved yet by any of those techniques. Considering the status of semiconductor devices in the art as the object of everlasting miniaturization and higher-than-ever integration, the significance of such measures for preventing the deposition of particles will continue to increase day after day.

It is taught that the particles generated in plasma are trapped in the vicinity of the interface between a plasma sheath and a plasma glow region in a reaction chamber (see T. Fukuzawa et al., Jpn. J. Appl. Phys., 33, 4212 (1994)). Also, in using an etching apparatus, when the etching process is completed and plasma is extinguished, the particles, which have been trapped in the vicinity of the interface between the plasma sheath and the plasma glow region, undesirably fall onto a substrate, thereby decreasing the yield of devices.

SUMMARY OF THE INVENTION

In view of the above-described problems, the present invention was made to increase the yield of an object by taking various measures for preventing the particles, which are trapped in the vicinity of the interface between a plasma sheath and a plasma glow region, from falling onto a substrate in an apparatus for fabricating a semiconductor device by utilizing plasma.

A first apparatus for fabricating a semiconductor device according to the present invention includes: a reaction chamber in which an object to be processed is positioned and subjected to plasma processing; plasma generating means for generating plasma regions above a region where the object is positioned in the reaction chamber, the plasma regions including a plasma glow region and a plasma sheath underlying the plasma glow region; at least one exhaust pipe having an opening in the vicinity of the interface between the plasma glow region and the plasma sheath; and exhaust means interposed in the exhaust pipe.

In this apparatus, as the plasma processing proceeds, particles such as reactants are once trapped in the vicinity of the interface between the plasma glow region and the plasma sheath, but are then exhausted through the opening of the exhaust pipe. Thus, when the plasma regions are extinguished, a smaller number of particles are present in the vicinity of the interface between the plasma glow region and the plasma sheath. Accordingly, it is possible to suppress the deposition of particles on an object to be processed.

In one embodiment of the present invention, the openings of the exhaust pipes are preferably provided so as to surround the outer periphery of the interface between the plasma glow region and the plasma sheath.

In such an embodiment, the number of particles can be reduced even more effectively.

A second apparatus for fabricating a semiconductor device according to the present invention includes: a reaction chamber in which an object to be processed is positioned and subjected to plasma processing; plasma generating means for generating plasma regions above a region where the object is positioned in the reaction chamber, the plasma regions including a plasma glow region and a plasma sheath underlying the plasma glow region; and a dust-collecting electrode disposed in the vicinity of the interface between the plasma glow region and the plasma sheath and biased at a positive potential.

In this apparatus, as the plasma processing proceeds, particles, such as reactants, being negatively charged are once trapped in the vicinity of the interface between the plasma glow region and the plasma sheath, but are then collected to the dust-collecting electrode biased at a positive potential. Thus, when the plasma regions are extinguished, a smaller number of particles exist in the vicinity of the interface between the plasma glow region and the plasma sheath. Accordingly, it is possible to suppress the deposition of particles on an object to be processed.

In one embodiment of the present invention, the dust-collecting electrodes are preferably disposed so as to surround the outer periphery of the interface between the plasma glow region and the plasma sheath.

In such an embodiment, the number of particles can be reduced even more effectively.

In another embodiment of the present invention, the apparatus preferably further includes: an exhaust pipe having an opening on the outer side of the dust-collecting electrode; and exhaust means interposed in the exhaust pipe.

In such an embodiment, since the particles collected in the dust-collecting electrode are exhausted through the exhaust pipe, the number of particles present in the entire reaction chamber can be reduced and the deposition of the particles on the object can be suppressed.

A third apparatus for fabricating a semiconductor device according to the present invention includes: a reaction chamber in which an object to be processed is positioned and subjected to plasma processing; plasma generating means for generating plasma regions above a region where the object is positioned in the reaction chamber, the plasma regions including a plasma glow region and a plasma sheath underlying the plasma glow region; light-collecting means, which is disposed in the vicinity of the interface between the plasma glow region and the plasma sheath and has a focus at a position inner to one end of the region where the object is positioned; and light-irradiating means for irradiating light on the light-collecting means.

In this apparatus, as the plasma processing proceeds, particles such as reactants are once trapped in the vicinity of the interface between the plasma glow region and the plasma sheath, but are then moved out of the region where the object is positioned owing to the function of the light-collecting means. Thus, when the plasma regions are extinguished, a smaller number of particles are present in the vicinity of the interface between the plasma glow region and the plasma sheath. Accordingly, it is possible to suppress the deposition of particles on an object to be processed.

In one embodiment of the present invention, the position of the focus is preferably movable in the direction of the diameter of the object by controlling the light-collecting means and the light-irradiating means.

In such an embodiment, the particles can be removed with more certainty.

In another embodiment of the present invention, multiple pairs of the light-collecting means and the light-irradiating means are preferably disposed so as to surround the outer periphery of the interface between the plasma glow region and the plasma sheath.

In such an embodiment, the deposition of the particles can be suppressed even more effectively.

In still another embodiment of the present invention, an exhaust port for exhausting a gas out of the reaction chamber is preferably provided below the light-collecting means.

In such an embodiment, the particles, which have been moved out of the region where the object is positioned, can be rapidly exhausted through the exhaust port. Thus, the number of particles present in the entire reaction chamber can be reduced rapidly and the deposition of the particles on the object can be suppressed even more effectively.

In still another embodiment, the plasma generating means may be a capacitively coupled plasma apparatus.

In still another embodiment, the plasma generating means may be a microwave resonance plasma apparatus.

In still another embodiment, the plasma generating means may be an inductively coupled plasma apparatus.

In still another embodiment, the plasma generating means may be a helicon wave plasma apparatus.

A method for fabricating a semiconductor device according to the present invention includes the steps of: positioning an object to be processed in a reaction chamber for performing plasma processing on the object; generating plasma regions above a region where the object is positioned in the reaction chamber, the plasma regions including a plasma glow region and a plasma sheath underlying the plasma glow region; and moving particles such as plasma reactants, which are trapped in the vicinity of the interface between the plasma glow region and the plasma sheath, to the outside of a region overlying the region where the object is positioned.

In accordance with this method, as the plasma processing proceeds, particles such as reactants are once trapped in the vicinity of the interface between the plasma glow region and the plasma sheath, but are then collected out of the region where the object is positioned. Thus, when the plasma regions are extinguished, a smaller number of particles are present in the vicinity of the interface between the plasma glow region and the plasma sheath. Accordingly, it is possible to suppress the deposition of particles on an object to be processed.

In one embodiment of the present invention, the method preferably further includes the step of exhausting the particles out of the reaction chamber.

In such an embodiment, since the particles, which have been moved out of the region where the object is positioned, can be rapidly exhausted out of the reaction chamber. Thus, the number of particles present in the entire reaction chamber can be reduced rapidly and the deposition of the particles on the object can be suppressed even more effectively.

BRIEF DESCRIPTION OF THE DRAWINGS

FIGS. 5($a$) and 5($b$) are partially enlarged views of FIG. 4 for illustrating the principle how the particles are moved by laser light when the apparatus of the third embodiment is in operation.

DESCRIPTION OF THE PREFERRED EMBODIMENTS

Hereinafter, preferred embodiments of the present invention will be described with reference to the accompanying drawings.

Embodiment 1

First, the first embodiment of the present invention will be described.

Figure 1:
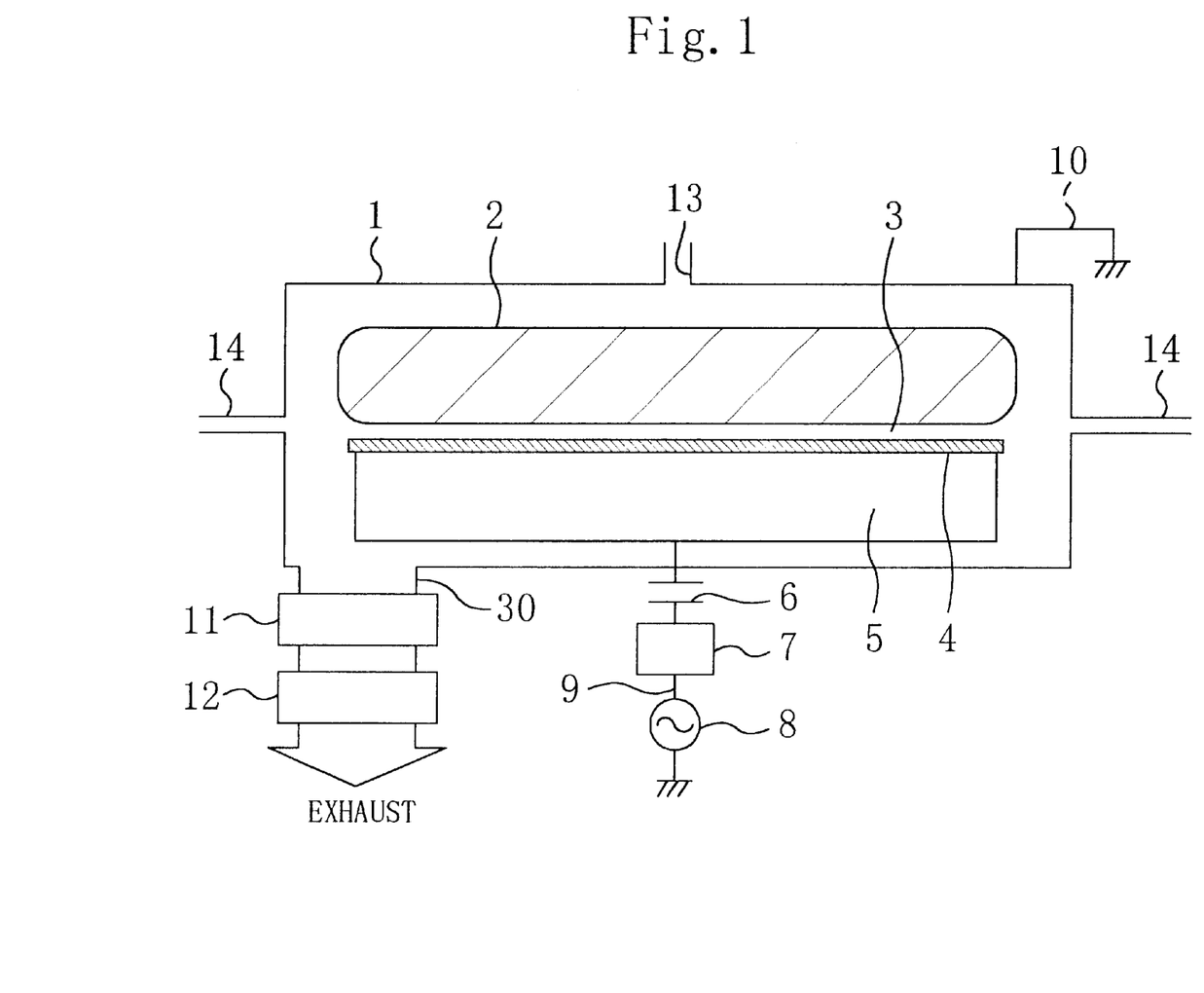
FIG. 1 is a block diagram illustrating, partially in section, an arrangement for an apparatus for fabricating a semiconductor device in the first embodiment of the present invention.

FIG. 1 is a block diagram illustrating, partially in section, an arrangement for an apparatus for fabricating a semiconductor device of the first embodiment. In FIG. 1, the reference numeral 1 denotes a reaction chamber. 2 denotes a plasma glow region. 3 denotes a plasma sheath. 4 denotes a substrate as an object to be processed. 5 denotes an electrode. 6 denotes a capacitor. 7 denotes a matching circuit. 8 denotes a radio frequency (RF) power supply. 9 denotes a power supply line for supplying RF power therethrough. 10 denotes a ground line. 11 denotes a turbo molecule pump. 12 denotes a dry pump. 13 denotes a gas inlet port. 30 denotes a main exhaust pipe. And 14 denotes an exhaust pipe for removing particles therethrough.

As shown in FIG. 1, the electrode 5 is disposed inside the reaction chamber 1. And this apparatus is constructed in such a manner that the reaction chamber 1 can be kept in a vacuum state by using the turbo molecule pump 11 and the dry pump 12 that are provided for the main exhaust pipe 30. A gas is introduced through the gas inlet port 13 into the reaction chamber 1 with the substrate 4 placed on the electrode 5, and a voltage is applied by the RF power supply 8 to the electrode 5 and the substrate 4, thereby generating plasma regions inside the reaction chamber 1.

As described above, the plasma sheath 3 is generated between the plasma glow region 2 and the substrate 4. And the particles, which have been generated as a result of plasma processing and the like, are trapped in the interface between the plasma glow region 2 and the plasma sheath 3.

This embodiment is characterized in that a large number of exhaust pipes 14, each having an opening, are disposed on substantially the same plane as the plane on which the interface between the plasma glow region 2 and the plasma sheath 3 is located. That is to say, the large number of openings are disposed all around the sidewall of the reaction chamber 1 at regular intervals so as to surround the interface between the plasma glow region 2 and the plasma sheath 3. Also, although not shown, these exhaust pipes 14 are connected to a different vacuum pump than that connected to the turbo molecule pump 11 and the dry pump 12 provided for the main exhaust pipe 30.

In such an arrangement, the particles, which are trapped in the vicinity of the interface between the plasma glow region 2 and the plasma sheath 3, can be rapidly exhausted through the exhaust pipe 14. Thus, when the plasma regions are extinguished, almost all the particles, which were present in the vicinity of the interface between the plasma glow region 2 and the plasma sheath 3, have already been removed. As a result, it is possible to prevent the particles from falling onto the substrate 4.

As can be understood, in the first embodiment, since the exhaust pipes 14, each having an opening, are disposed in the vicinity of the interface between the plasma glow region 2 and the plasma sheath 3, an apparatus suitable for fabricating a semiconductor device substantially without depositing particles thereon can be provided.

In this embodiment, the openings of the exhaust pipes 14 are provided over the entire sidewall of the reaction chamber 1. Alternatively, even when such openings are formed at 2 to 4 positions or even when a single opening is formed at only one position, the particles can still be removed effectively.

Embodiment 2

Next, the second embodiment of the present invention will be described.

Figure 2:
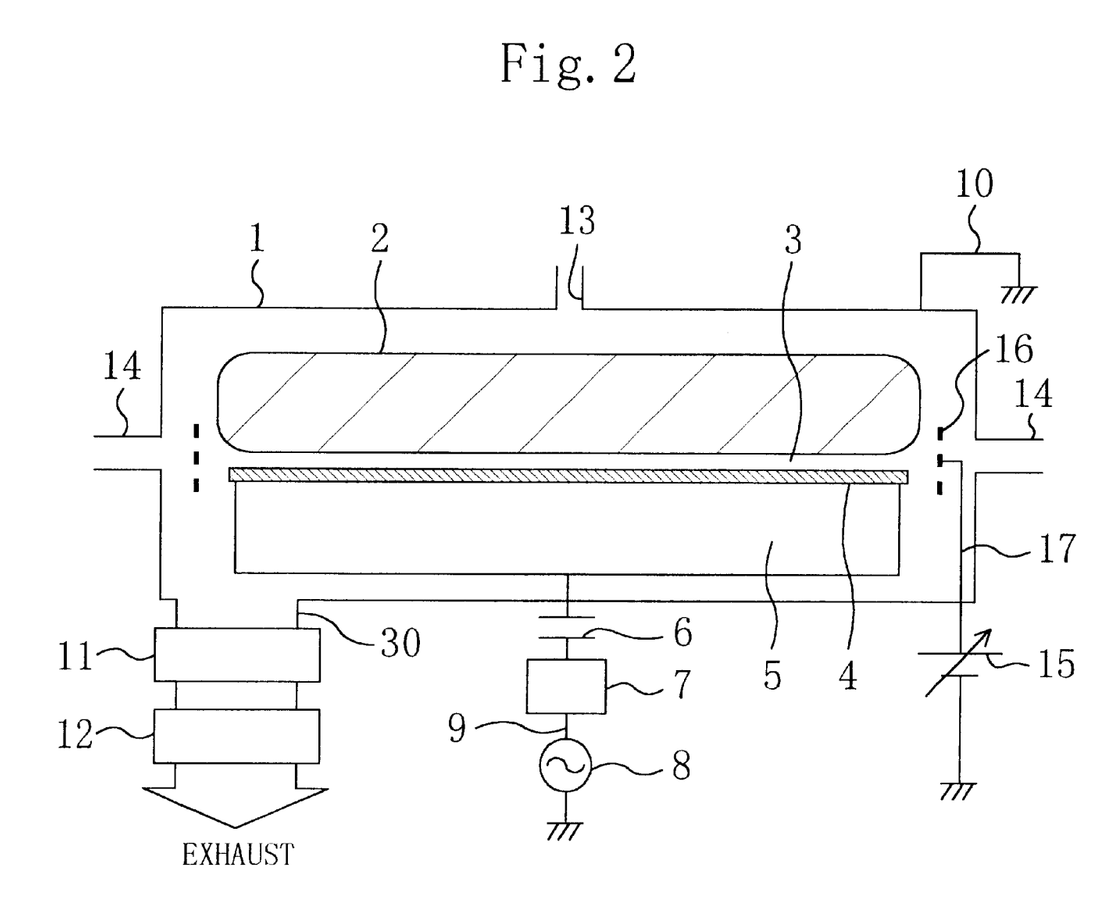
FIG. 2 is a block diagram illustrating, partially in section, an arrangement for an apparatus for fabricating a semiconductor device in the second embodiment of the present invention.

FIG. 2 is a block diagram illustrating, partially in section, an arrangement for an apparatus for fabricating a semiconductor device of the second embodiment. In FIG. 2, the reference numeral 1 denotes a reaction chamber. 2 denotes a plasma glow region. 3 denotes a plasma sheath. 4 denotes a substrate as an object to be processed. 5 denotes an electrode. 6 denotes a capacitor. 7 denotes a matching circuit. 8 denotes an RF power supply. 9 denotes a power supply line for supplying RF power therethrough. 10 denotes a ground line. 11 denotes a turbo molecule pump. 12 denotes a dry pump. 13 denotes a gas inlet port. 30 denotes a main exhaust pipe. 14 denotes an exhaust pipe. 15 denotes a voltage source. 16 denotes a dust-collecting electrode. And 17 denotes a power supply line for supplying power to the dust-collecting electrode 16.

As shown in FIG. 2, the electrode 5 is disposed inside the reaction chamber 1. And this apparatus is constructed in such a manner that the reaction chamber 1 can be kept in a vacuum state by using the turbo molecule pump 11 and the dry pump 12. A gas is introduced through the gas inlet port 13 into the reaction chamber 1 with the substrate 4 placed on the electrode 5 and a voltage is applied by the RF power supply 8 to the electrode 5 and the substrate 4, thereby generating plasma regions inside the reaction chamber 1.

As described above, the plasma sheath 3 is generated between the plasma glow region 2 and the substrate 4. And the particles, which have been generated as a result of plasma processing and the like, are trapped in the interface between the plasma glow region 2 and the plasma sheath 3.

In the same way as in the first embodiment, a large number of exhaust pipes 14, each having an opening, are also disposed in this embodiment on substantially the same plane as the plane on which the interface between the plasma glow region 2 and the plasma sheath 3 is located. That is to say, the large number of openings are provided all over the side-wall of the reaction chamber 1 at regular intervals so as to surround the interface between the plasma glow region 2 and the plasma sheath 3. In addition, in this embodiment, mesh-shaped dust-collecting electrodes 16 are disposed in front of the openings of the exhaust pipes 14 so as to surround the interface between the plasma glow region 2 and the plasma sheath 3. These dust-collecting electrodes 16 are connected to the voltage source 15 through the power supply line 17 and are biased at a positive potential.

In such an arrangement, since the particles trapped in the vicinity of the interface between the plasma glow region 2 and the plasma sheath 3 are negatively charged, the particles are trapped to the dust-collecting electrodes 16 and then exhausted through the exhaust pipes 14. Thus, when the plasma regions are extinguished, almost all the particles, which were present in the vicinity of the interface between the plasma glow region 2 and the plasma sheath 3, have already been removed. As a result, it is possible to prevent the particles from falling onto the substrate 4.

Figure 3:
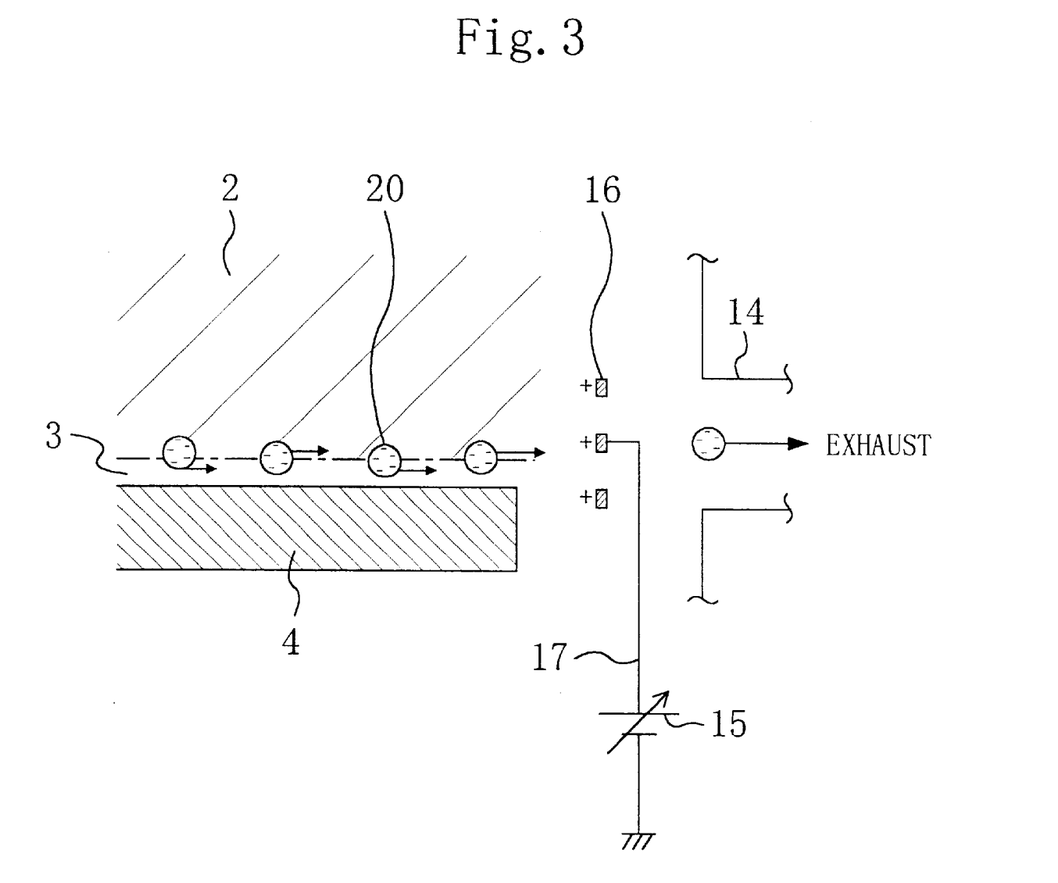
FIG. 3 is a partially enlarged view of FIG. 2 for illustrating the movement of particles when the apparatus of the second embodiment is in operation.

FIG. 3 is a partially enlarged view of FIG. 2 for illustrating the movement of particles in the apparatus of the second embodiment. In FIG. 3, a region in the vicinity of the region where the dust-collecting electrode 16 is disposed 16 is illustrated on a larger scale. The reference numeral 20 denotes the particles.

As shown in FIG. 3, the negatively charged particles 20, which have been trapped in the interface between the plasma glow region 2 and the plasma sheath 3, are attracted by the coulomb force to the dust-collecting electrode 16 biased by the voltage source 15 at a positive potential. Then, the particles pass through the holes of the dust-collecting electrode 16 so as to be exhausted through the exhaust pipe 14.

As can be understood, in the second embodiment, since the dust-collecting electrodes 16 are disposed around the electrode 5, an apparatus suitable for fabricating a semiconductor device substantially without depositing particles thereon can be provided.

In this embodiment, the openings of the exhaust pipes 14 are formed over the entire sidewall of the reaction chamber 1. Alternatively, even when such openings are formed at 2 to 4 positions or even when a single opening is formed at only one position, the particles can still be removed effectively.

Embodiment 3

Next, the third embodiment of the present invention will be described.

Figure 4:
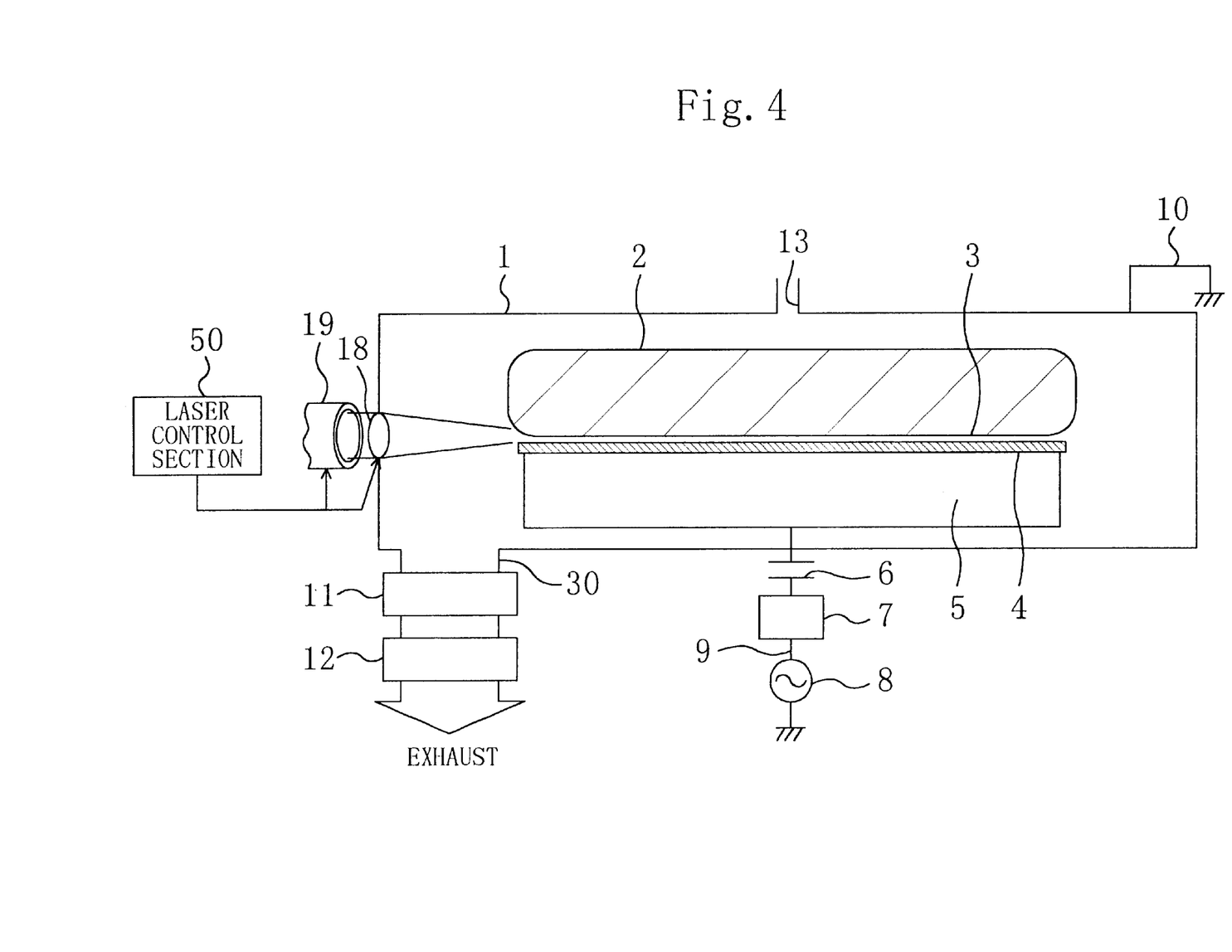
FIG. 4 is a block diagram illustrating, partially in section, an arrangement for an apparatus for fabricating a semiconductor device in the third embodiment of the present invention.

FIG. 4 is a block diagram illustrating, partially in section, an arrangement for an apparatus for fabricating a semiconductor device of the third embodiment. In FIG. 4, the reference numeral 1 denotes a reaction chamber. 2 denotes a plasma glow region. 3 denotes a plasma sheath. 4 denotes a substrate as an object to be processed. 5 denotes an electrode. 6 denotes a capacitor. 7 denotes a matching circuit. 8 denotes an RF power supply. 9 denotes a power supply line for supplying RF power therethrough. 10 denotes a ground line. 11 denotes a turbo molecule pump. 12 denotes a dry pump. 13 denotes a gas inlet port. 30 denotes a main exhaust pipe. 18 denotes a lens as light-collecting means. 19 denotes a laser light irradiation port as light-irradiating means. And 50 denotes a laser control section.

As shown in FIG. 4, the electrode 5 is disposed inside the reaction chamber 1. And this apparatus is constructed in such a manner that the reaction chamber 1 can be kept in a vacuum state by using the turbo molecule pump 11 and the dry pump 12. A gas is introduced through the gas inlet port 13 into the reaction chamber 1 with the substrate 4 placed on the electrode 5 and a voltage is applied by the RF power supply 8 to the electrode 5 and the substrate 4, thereby generating plasma regions inside the reaction chamber 1.

As described above, the plasma sheath 3 is generated between the plasma glow region 2 and the substrate 4. And the particles, which have been generated as a result of plasma processing and the like, are trapped in the interface between the plasma glow region 2 and the plasma sheath 3.

This embodiment is characterized in that the laser light irradiation port 19 is disposed on the same plane as the plane on which the interface between the plasma glow region 2 and the plasma sheath 3 is located and above the opening of the exhaust pipe 30. That is to say, the feature of this embodiment lies in that the laser light is introduced via the lens 18 into the vicinity of the interface between the plasma glow region 2 and the plasma sheath 3. In such an arrangement, the particles, which have been trapped in the vicinity of the interface between the plasma glow region 2 and the plasma sheath 3, are forced to move toward the lens 18 owing to the function of the laser light. Then, the particles are exhausted through the exhaust port of the main exhaust pipe 30. However, the position of the focus of the lens 18 is movable in the direction of the diameter of the substrate 4 by operating the laser control section 50. Thus, when the plasma regions are extinguished, almost all the particles, which were present over the substrate 4 in the vicinity of the interface between the plasma glow region 2 and the plasma sheath 3, have already been removed. As a result, it is possible to prevent the particles from falling onto the substrate 4.

Figure 5A:
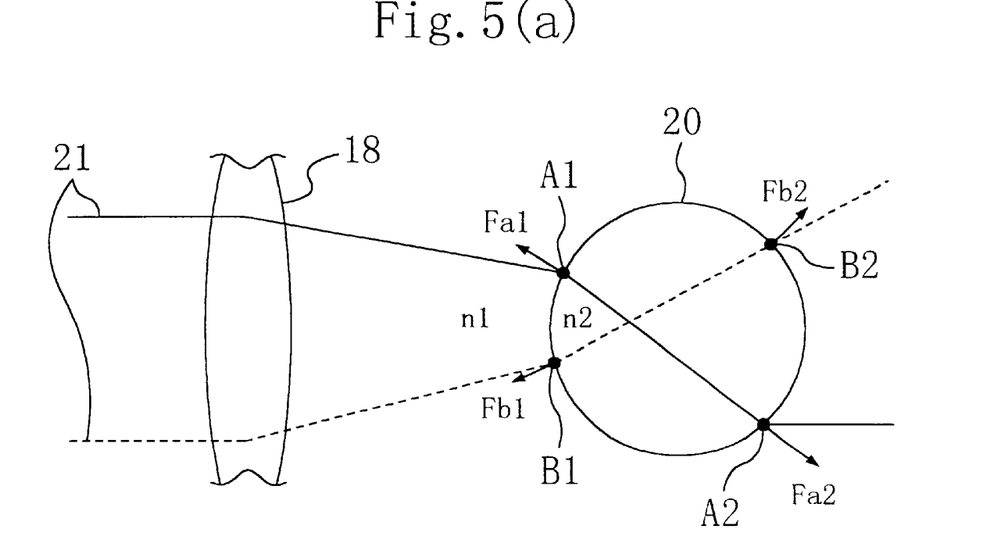
Figure 5B:
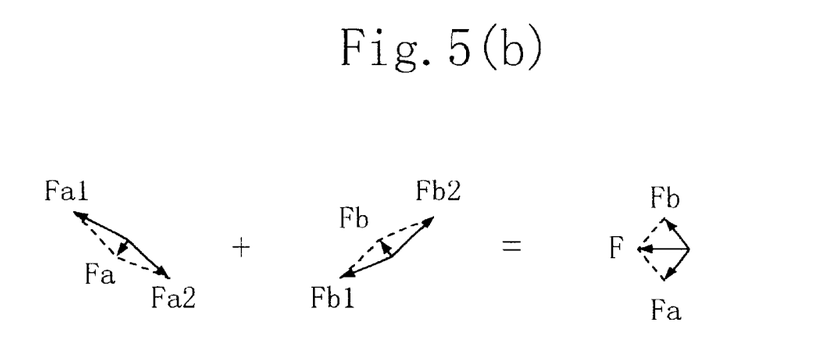

FIGS. 5(a) and 5(b) are partially enlarged views of FIG. 4 illustrating the principle how the particles are forced to move by the laser light in this embodiment. In FIGS. 5(a) and 5(b), the vicinity of the region where the lens 18 is disposed is illustrated on a larger scale. The reference numeral 20 denotes a particle and 21 denotes an optical path of the laser light. The laser light has momentum given by n1·I/c (where n1 is a refractive index, I is an intensity of light and c is a velocity of light). Thus, when the laser light enters the particle 20 having a different refractive index n2, the momentum of the light changes and forces are applied to the particle 20. In this case, four forces Fa1, Fa2, Fb1 and Fb2 are respectively applied to the particle 20 at four positions A1, A2, B1 and B2 having respectively different refractive indices.

As shown in FIG. 5(b), the resultant F of the four forces Fa1, Fa2, Fb1 and Fb2 is applied in such a manner as to move the particle 20 toward the lens 18. Considering that the focal position of the lens 18 is movable in the direction of the diameter of the substrate 4, the particles 20 can be forced to move over the entire surface of the substrate 4 toward a position immediately over the opening of the exhaust pipe 30 without making the particles 20 fall onto the substrate 4. As a result, it is possible to prevent the particles 20 from depositing on the substrate 4.

As can be understood, in the third embodiment, since the laser light irradiating port 19 is provided to be aligned with the interface between the plasma glow region 2 and the plasma sheath 3, an apparatus for fabricating a semiconductor device substantially without depositing particles thereon can be provided. In particular, if the position of the focus is moved in the direction of the diameter of an object to be processed by making the laser control section 50 control the light-collecting means and the light-irradiating means, then even more remarkable effects can be attained.

In this embodiment, only one opening is provided for the main exhaust pipe 30 and a single laser light irradiating port 19 and a single lens 18 are disposed correspondingly. However, the present invention is not limited to such an embodiment. For example, several openings may be additionally provided for another main exhaust pipe 30 and/or other exhaust pipes connected to another vacuum pump as in the first embodiment. In such an embodiment, the same number of laser light irradiating ports 19 and lenses 18 as the number of the openings may be provided to face the respective openings. Alternatively, even when a different number of laser light irradiating ports 19 and lenses 18 from the number of the openings of the exhaust pipes are provided at different positions from those of the openings of the exhaust pipes, the particles can still be moved out of the substrate. Thus, even in such an embodiment, the same effects as those of this embodiment can also be attained.

Moreover, instead of a convex lens as that used in this embodiment, an equivalent member such as a concave mirror or a Fresnel lens may also be used. Furthermore, white light or the like may also be used instead of laser light.

It is noted that the plasma apparatus of the present invention may be embodied in an arbitrary plasma apparatus such as a capacitively coupled plasma apparatus, a microwave resonance plasma apparatus, an inductively coupled plasma apparatus or a helicon wave plasma apparatus.

What is claimed is:

1. An apparatus for fabricating a semiconductor device, the apparatus comprising:
   a reaction chamber in which an object to be processed is positioned and subjected to plasma processing of a gas introduced into the reaction chamber;
   plasma generating means for generating plasma regions above a region where the object is positioned in the reaction chamber, the plasma regions including a plasma glow region and a plasma sheath underlying the plasma glow region;
   at least one dust-collecting electrode disposed inside the reaction chamber, and disposed so as to intersect with the same plane as the interface between the plasma glow region and the plasma sheath and biased at a positive potential;
   a voltage source connected to said at least one dust-collecting electrode to bias said at least one dust-collecting electrode,
   an exhaust pipe disposed on a wall of the reaction chamber facing said at least one dust-collecting electrode, and having an opening for simultaneously exhausting said gas and particles attracted to said at least one dust-collecting electrode in generating plasma, said opening extending substantially perpendicular to said at least one dust-collecting electrode and positioned about an axis corresponding to the direction of movement of particles attracted by said at least one dust collecting electrode.

2. The apparatus of claim 1, wherein the plasma generating means is a capacitively coupled plasma apparatus.

3. The apparatus of claim 1, wherein the plasma generating means is a microwave resonance plasma apparatus.

4. The apparatus of claim 1, wherein the plasma generating means is an inductively coupled plasma apparatus.

5. The apparatus of claim 1, wherein the plasma generating means is a helicon wave plasma apparatus.

6. The apparatus of claim 1, wherein said at least one dust-collecting electrode includes openings so as to allow particles to pass through said at least one dust-collecting electrode.

7. The apparatus of claim 1, wherein said particles, which are not collected by said at least one dust-collecting electrode, continue moving in substantially the same direction into said opening of said exhaust pipe.

8. An apparatus for fabricating a semiconductor device, the apparatus comprising:

a reaction chamber in which an object to be processed is positioned and subjected to plasma processing;

plasma generating means for generating plasma regions above a region where the object is positioned in the reaction chamber, the plasma regions including a plasma glow region and a plasma sheath underlying the plasma glow region;

light collecting-focusing device disposed between a laser and the plasma, such that a focus point of a laser beam can be formed on the same plane as the interface between the plasma glow region and the plasma sheath and at a position inner to one end of the region where the object is positioned, wherein the laser in conjunction with the light collecting-focusing device move the focus point, formed by irradiating light on the light collecting-focusing device, parallel to a surface of the object, and thereby irradiates focused light on particles and removes the particles from the interface between the plasma glow region and the plasma sheath.

9. The apparatus of claim 8, wherein multiple pairs of light-collecting means and lasers are disposed so as to surround the outer periphery of the interface between the plasma glow region and the plasma sheath.

10. The apparatus of claim 8, wherein an exhaust port for exhausting a gas out of the reaction chamber is provided below the light collecting means.

* * * * *

UNITED STATES PATENT AND TRADEMARK OFFICE
CERTIFICATE OF CORRECTION

PATENT NO.   : 6,669,812 B2
DATED        : December 30, 2003
INVENTOR(S)  : Jiwari, N. et al.

It is certified that error appears in the above-identified patent and that said Letters Patent is hereby corrected as shown below:

Title page,
Item [75], Inventors, add -- Shinichi Imai, Osaka (JP) --

Signed and Sealed this

Twenty-seventh Day of July, 2004

JON W. DUDAS
*Acting Director of the United States Patent and Trademark Office*